(12) United States Patent
Ely et al.

(10) Patent No.: US 10,312,039 B2
(45) Date of Patent: Jun. 4, 2019

(54) GENERATOR BUTTON FOR ELECTRONIC DEVICES

(71) Applicant: Apple Inc., Cupertino, CA (US)

(72) Inventors: Colin M. Ely, Cupertino, CA (US); Eric G. de Jong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 382 days.

(21) Appl. No.: 14/917,529

(22) PCT Filed: Sep. 10, 2013

(86) PCT No.: PCT/US2013/059096
§ 371 (c)(1),
(2) Date: Mar. 8, 2016

(87) PCT Pub. No.: WO2015/038103
PCT Pub. Date: Mar. 19, 2015

(65) Prior Publication Data
US 2016/0217953 A1    Jul. 28, 2016

(51) Int. Cl.
*H01H 9/00* (2006.01)
*H01H 36/02* (2006.01)
(Continued)

(52) U.S. Cl.
CPC .......... *H01H 36/02* (2013.01); *G06F 1/1633* (2013.01); *G06F 1/1671* (2013.01); *G06F 1/3271* (2013.01); *G06F 3/0202* (2013.01); *H01H 9/54* (2013.01); *H03K 17/97* (2013.01); *H03K 2217/0081* (2013.01); *H03K 2217/96038* (2013.01); *Y02D 10/156* (2018.01); *Y02D 50/20* (2018.01)

(58) Field of Classification Search
CPC ........ H01H 36/02; H01H 9/54; G06F 1/1633; G04G 21/00; G04G 21/08
USPC .......................................................... 335/205
See application file for complete search history.

(56) References Cited

U.S. PATENT DOCUMENTS 1,750,895 A * 3/1930 Leyhausen ............. H01H 73/44
                                                                    218/26
2,120,876 A * 6/1938 Trautner ................ H01H 3/503
                                                                    200/318
(Continued)

OTHER PUBLICATIONS

Invitation to Pay Additional Fees dated May 14, 2014, PCT/US2013/059096, 6 pages.
(Continued)

*Primary Examiner* — Shawki S Ismail
*Assistant Examiner* — Lisa N Homza
(74) *Attorney, Agent, or Firm* — Brownstein Hyatt Farber Schreck, LLP

(57) ABSTRACT

One embodiment of the present disclosure includes an electronic device. The electronic device includes an enclosure and a button connected to the enclosure and movable relative thereto. The button includes a button cap defining a user input surface, a first magnetic element operably associated with one of the button cap or the enclosure, and a coil operably associated with the other of the button cap or the enclosure. Movement of the button cap relative to the enclosure, such as due to a user input force, causes the first magnetic element to induce a current in the coil and the induced current is correlated to a user input to the button cap.

20 Claims, 8 Drawing Sheets

(51) Int. Cl.
*H03K 17/97* (2006.01)
*G06F 1/16* (2006.01)
*G06F 1/3234* (2019.01)
*G06F 3/02* (2006.01)
*H01H 9/54* (2006.01)

(56) References Cited

U.S. PATENT DOCUMENTS

| | | | | | |
|---|---|---|---|---|---|
| 2,777,910 | A | * | 1/1957 | Jordan | H01H 13/063 200/302.2 |
| 2,984,726 | A | * | 5/1961 | Roeser | H01H 13/063 200/296 |
| 3,316,379 | A | * | 4/1967 | Clarke | H01H 13/06 200/302.2 |
| 3,432,782 | A | * | 3/1969 | Ellenberger | H01H 71/142 335/170 |
| 3,448,419 | A | * | 6/1969 | Myatt | H01H 13/06 335/206 |
| 3,671,777 | A | * | 6/1972 | Newell | H03K 3/315 327/169 |
| 3,855,488 | A | * | 12/1974 | Britton | H03K 17/9643 307/108 |
| 3,973,099 | A | * | 8/1976 | Morris, Sr. | G04C 3/001 200/511 |
| 4,950,922 | A | * | 8/1990 | Krummer | H03K 17/97 307/116 |
| 5,575,380 | A | * | 11/1996 | Imai | H01H 9/04 200/302.2 |
| 5,911,529 | A | * | 6/1999 | Crisan | G06F 1/26 400/472 |
| 6,626,473 | B1 | * | 9/2003 | Klein | B29C 45/1676 200/302.2 |
| 2005/0145472 | A1 | * | 7/2005 | Beckwith | G08G 1/005 200/521 |
| 2015/0357893 | A1 | * | 12/2015 | Deak, Sr. | H02K 35/06 310/38 |
| 2016/0134173 | A1 | * | 5/2016 | Deak, Sr. | H02K 35/02 290/1 A |
| 2016/0172136 | A1 | * | 6/2016 | McGaffey | H03K 17/97 335/179 |

OTHER PUBLICATIONS

International Search Report and Written Opinion dated Aug. 12, 2014, PCT/US2013/059096, 16 pages.

* cited by examiner

GENERATOR BUTTON FOR ELECTRONIC DEVICES

TECHNICAL FIELD

The present invention relates generally to electronic devices, and more specifically, to input devices for computing devices.

BACKGROUND

Many types of electronic devices, such as smart phones, gaming devices, computers, watches, and the like, include input devices, such as buttons or switches to receive user input. Often, these input buttons or switches may include a tactile element to provide feedback to a user as he or she provides input to the button. However, as electronic devices become smaller, space available for buttons and switches, especially those that compress, becomes smaller.

Additionally, many non-mechanically based input buttons, such as capacitive sense buttons, generally require that the sensor be powered at all times, even when the electronic device is idle, in order to detect user input to the device. The constant power that is provided to the sensor may drain the battery or other power source, which may reduce the active time of the electronic device between charges.

SUMMARY

One example of the present disclosure includes an electronic device. The electronic device includes an enclosure and a button connected to the enclosure and movable relative thereto. The button includes a button cap defining a user input surface, a first magnetic element operably associated with one of the button cap or the enclosure, and a coil operably associated with the other of the button cap or the enclosure. Movement of the button cap relative to the enclosure, such as due to a user input force, causes the first magnetic element to induce a current in the coil and the induced current is correlated to a user input to the button cap.

Another example of the disclosure includes an input assembly for a computing device. The input assembly includes a housing and a user input surface operably connected to the housing and movable relative thereto. The input assembly further includes a magnetic element connected to the user input surface and an induction component operably connected to the housing an in communication with the magnetic element. In a first mode, when a user force is applied to the user input surface, the user input surface moves in a first direction causing the magnetic element to move relative to the induction component, inducing a first signal in the induction component.

Yet another example of the disclosure includes a method of detecting a user input. The method includes moving a magnetic element relative to an induction coil in response to a first parameter of the user input, inducing a first current in the induction coil corresponding to the first parameter of the user input, activating a sensor configured to detect a second parameter of the user input, and detecting by the sensor the second parameter of the user input, wherein the second parameter of the user input is different from the first parameter.

SPECIFICATION

Overview

Some embodiments herein include a compact electronic device, such as a wearable electronic device, smart phone, portable music player, gaming device, or the like, including an induction button. The induction button functions as an input device to provide user input to the electronic device and optionally may provide feedback, such as haptic feedback, to the user. The induction button may include coils at least partially surrounding a movable component of the induction button, such as a button cap, and a magnetic element (such as a permanent magnet or an electromagnet), positioned on the button cap. In another embodiment, the coils may be positioned on the button cap and the magnetic element may be positioned on the housing. In operation, the induction button may be configured such that as the button cap is moved relative to the housing (such as due to a user input force), the magnet and the coils may be moved relative to one another. As the magnetic element is moved relative to the coils or as the coils are moved relative to the magnetic element, a current is induced. The induced current may be correlated to the user input to the button cap, without requiring the induction button to draw any power from a power source.

Additionally, the coils may be provided with a current that may cause the magnetic element to move relative thereto. In instances where the magnetic element is positioned on the button, as the coils receive current, the coils may magnetically interact with the magnetic element to selectively pull or push the magnetic element. This magnetic force may be used in a feedback mode to provide haptic feedback to a user and/or to vary the input resistance of the button cap as a user provides an input force thereto. Conventional components for provide feedback in a button typically include a collapsible dome or tactile switch. These types of components typically are aligned or in series with the direction of travel, which may increase the thickness or z-height of the button stack. In instances where the coils and magnetic element of the induction button are configured to provide user feedback, there may not be an increased thickness for the button stack because neither the coils nor the magnetic element may be required be positioned in series with the travel direction.

In some embodiments the induction button may further include a sensing element, such as a capacitive sensor, that may be used to sense additional characteristics of the user input. In these embodiments, the interaction of the coils and the magnetic may be used to wake the sensing element when a user input is received when the electronic device is in idle or sleep mode. This may decrease the power consumption of the sensing element during non-active times for the electronic device, but still allow the sensing element to detect user inputs during idle or sleep modes.

Figure 1:
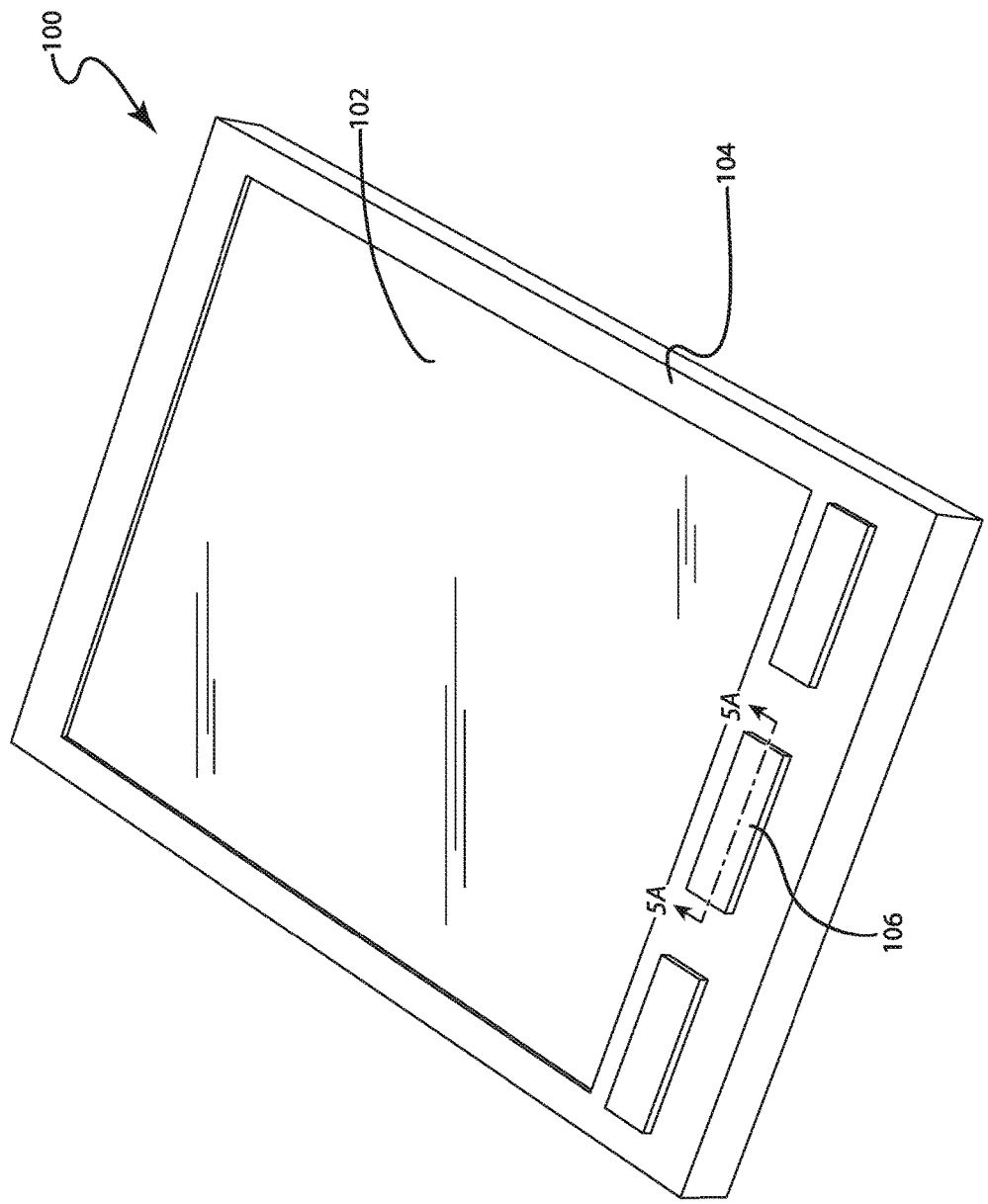
FIG. 1 is a front perspective view of a first example of an electronic device including an induction button.

Turning now to the figures, an illustrative electronic device including the induction button will now be discussed. FIG. 1 is a perspective view of an electronic device 100 including a screen 102, an enclosure 104 substantially surround the screen 102, and an induction button 106. In the embodiment illustrated in FIG. 1, the electronic device 100 is a smart phone.

Figure 2:
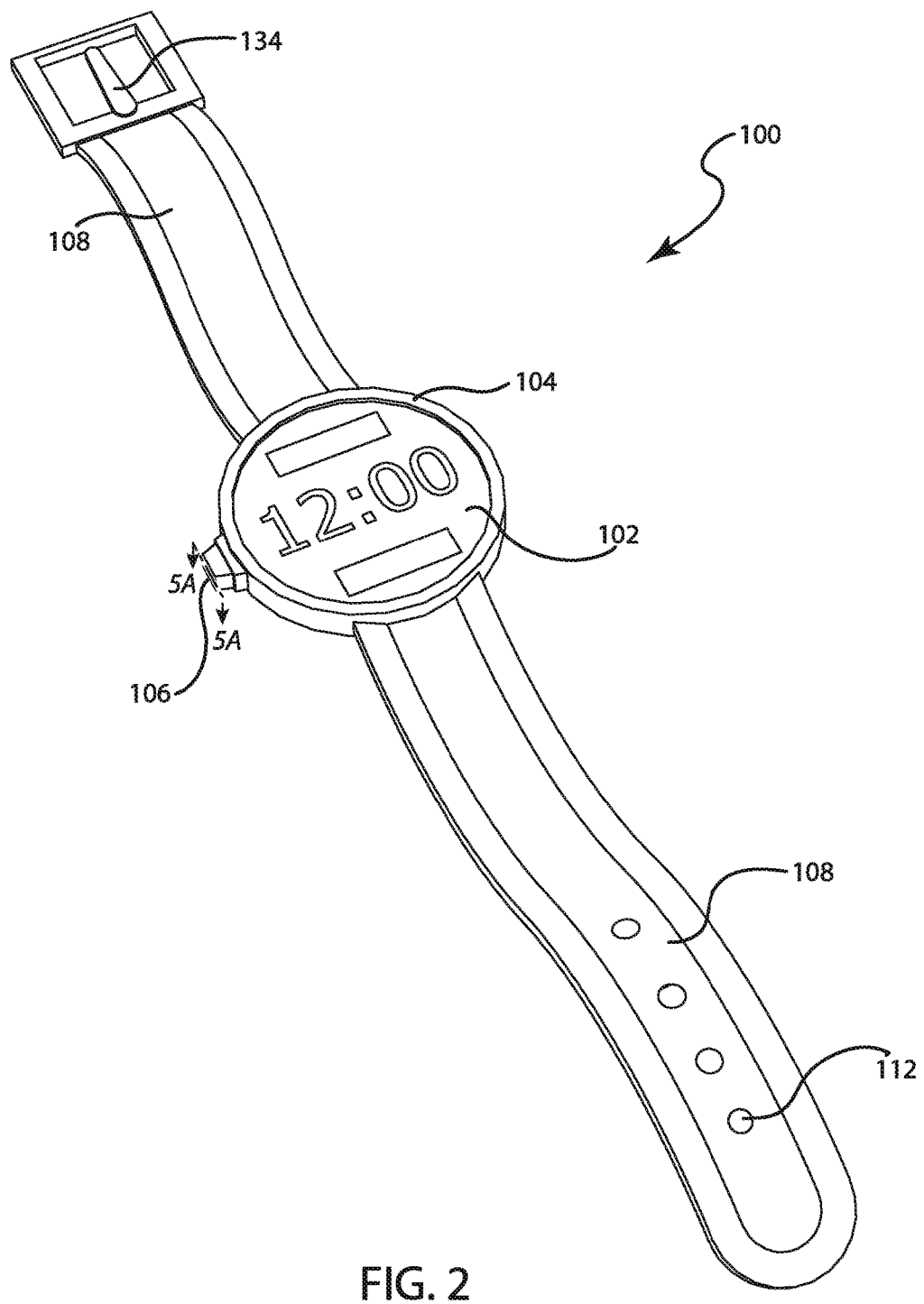
FIG. 2 is a front elevation view of a second example of an electronic device including the induction button.

However, in other embodiments, the electronic device 100 may be a wearable device, such as a watch. FIG. 2 is a front elevation view of another example of the electronic device 100. In this example, the electronic device 100 may be more compact than the embodiment illustrated in FIG. 1 and optionally may include a band 108 or other attachment element that may be used to attach the electronic device to a user. The band 108 may include a buckle 134 or other type of clasping or securing element. In instances where the securing element is the buckle 134, the strap 108 may include one or more band apertures 112 that receive a prong of the buckle 134 to secure the band around a user's wrist, arm, or the like.

With reference to FIG. 2, in many embodiments, the electronic device 100 may include a screen 102. The screen 102 may be substantially any type of component that displays visual output. For example, the screen 102 may be a liquid crystal display (LCD), a plasma display, or the like. The screen 102 may also include one or more input sensors, such as a multi-touch sensors, or the like that may detect user input to the screen 102.

An enclosure 104 surrounds the screen 102 as well as a portion of the induction button 106 and other elements of the electronic device 100. The enclosure 104 generally provides a housing or case to protect the internal components of the electronic device 100. In many embodiments, the enclosure 104 and the display 102 may together define an internal cavity for the electronic device 100 that may house one or more internal components.

The induction button 106 provides user input to the electronic device 100. The induction button 106 may include one or more components that may be physically manipulated (e.g., moved) by a user. Movement of the select components provides an electronic signal to a processing element corresponding to the user input. The induction button 106 will be discussed in more detail below, but generally may not consume power during an idle or sleep state of the electronic device, and often may use the user input force to generate power for the electronic device.

Figure 3:
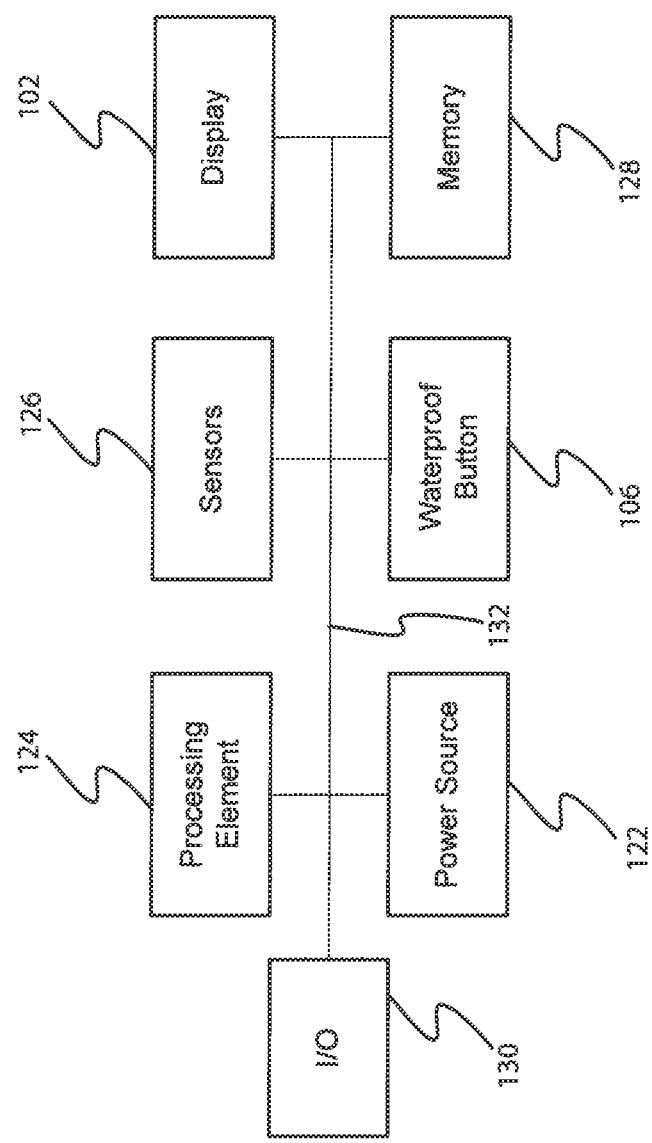
FIG. 3 is a simplified block diagram of the electronic device incorporating the induction button.

FIG. 3 is a simplified block diagram of the electronic device 100. With reference to FIG. 3, the electronic device 100 may include a power source 122, one or more processing elements 124, a memory component 128, one or more sensors 126, and an input/output component 130. Each of the internal components may be received within the enclosure 104 and may be in communication through one or more systems buses 132, traces, printed circuit boards, or other communication mechanisms.

The power source 122 provides power to the components of the electronic device 100, 200. The power source 122 may be a battery or other portable power element. Additionally, the power source 122 may be rechargeable or replaceable.

The processing element 124 or processor is substantially any type of device that can receive and execute instructions. For example, the processing element 124 may be a processor, microcomputer, or the like. Additionally, the processing element 124 may include one or more processors and in some embodiments may include multiple processing elements.

The one or more sensors 126 may be configured to sense a number of different parameters or characteristics that may be used to influence one or more operations of the electronic device 100, 200. For example, the sensors 126 may include accelerometers, gyroscopes, capacitive sensors, light sensors, image sensors, pressure or force sensors, or the like. As will be discussed in more detail below, one or more of the sensors 126 may be used in conjunction with the induction button 106 or separate therefrom, to provide user input to the electronic device 100.

With continued reference to FIG. 3, the memory component 128 stores electronic data that may be utilized by the electronic device 100. For example, the memory component 128 may store electrical data or content e.g., audio files, video files, document files, and so on, corresponding to various applications. The memory 128 may be, for example, non-volatile storage, a magnetic storage medium, optical storage medium, magneto-optical storage medium, read only memory, random access memory, erasable programmable memory, or flash memory.

The input/output interface 130 may receive data from a user or one or more other electronic devices. Additionally, the input/output interface 130 may facilitate transmission of data to a user or to other electronic devices. For example, the input/output interface 130 may be used to receive data from a network, or may be used to send and transmit electronic signals via a wireless or wired connection (Internet, WiFi, Bluetooth, and Ethernet being a few examples). In some embodiments, the input/output interface 130 may support multiple network or communication mechanisms. For example, the network/communication interface 130 may pair with another device over a Bluetooth network to transfer signals to the other device, while simultaneously receiving data from a WiFi or other network.

Figure 5A:
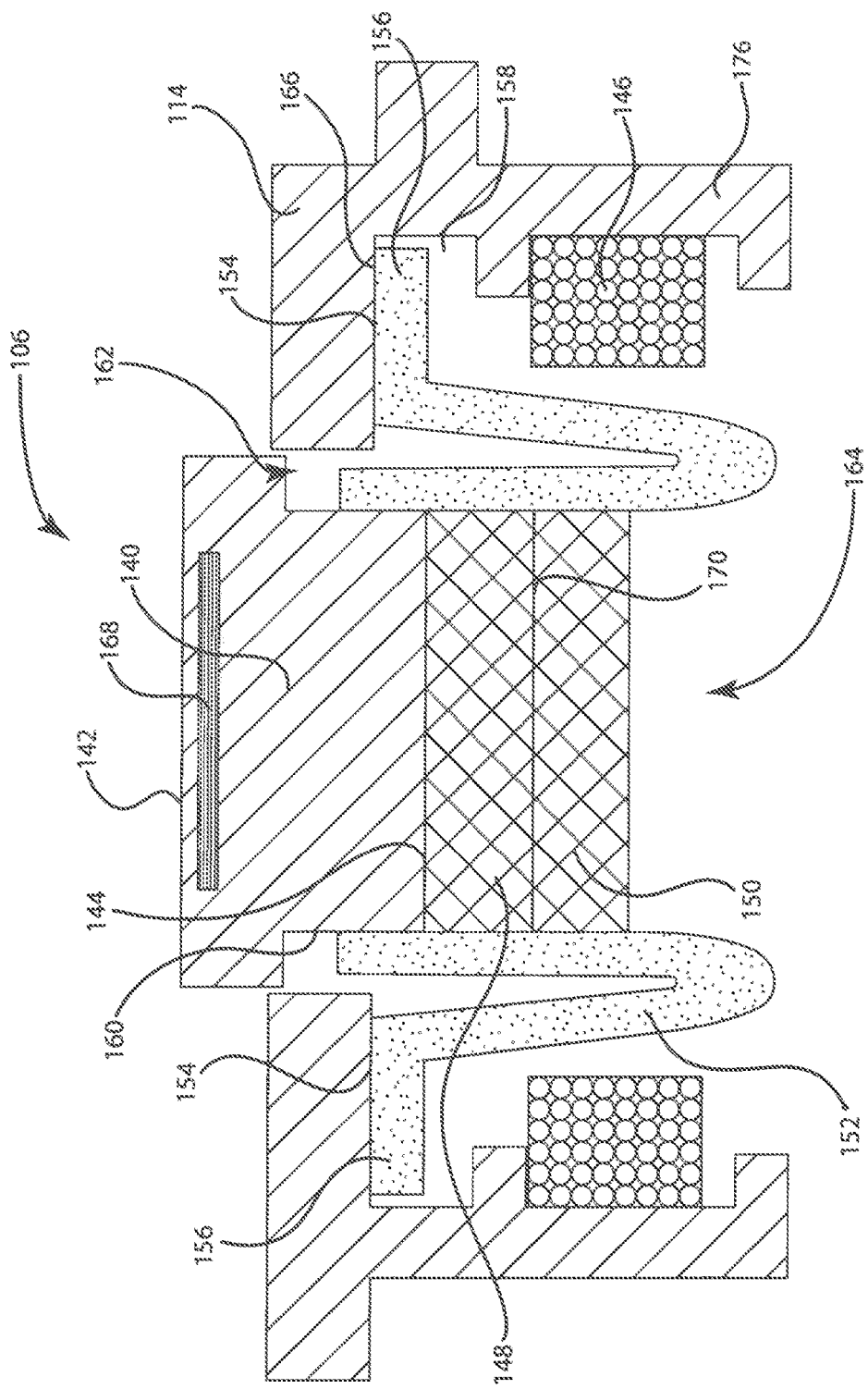
FIG. 5A is a cross-section view of the electronic device taken along line 5A-5A in FIG. 1 or 2 illustrating a first example of the induction button.

The induction button 106 will now be discussed in more detail. FIG. 5A is a cross-section view of the electronic device 100 taken along line 5A-5A in FIG. 1 or 2. The induction button 106 is connected to the enclosure 114 and may be movable relative thereto. With reference to FIG. 5A, the induction button may include a button cap 140, a seal 152, a coil 146, and a magnetic element 170, each of which will be discussed in turn.

The button cap 140 forms a user input or engagement surface and includes a top surface 142, sidewalls 160, and a bottom surface 144. The button cap 140 may be shaped and dimensioned as required and may include one or more aesthetic elements, such as lacquers, coatings, or the like. In one embodiment, as shown in FIG. 5A, the button cap 140 may have a "T" shape in cross-section and the top surface 142 may have a longer length than the bottom surface 144.

The magnetic element 170 may be connected to the bottom surface 144 of the button cap 140. However, in other embodiments, the magnetic element 170 may be connected to the enclosure 114. The magnetic element 170 may be a permanent magnet or may be an electromagnet. Additionally, the magnetic element 170 may include two or more magnets or alternatively may include areas of different polarization. For example, in some embodiments, the magnetic element 170 may include a first magnet 148 having a first polarization and a second magnet 150 having a second polarization. As a specific example, the first magnet 148 may form the north pole for the magnetic element 170 and the second magnet 150 may form the south pole of the magnetic element 170. However, in other embodiments, the first magnet 148 may form the south pole and the second magnet 150 may form the north pole. The orientation of the polarization for the magnetic element 170 may varied as desired and based on the configuration of the coils 146.

Figure 4:
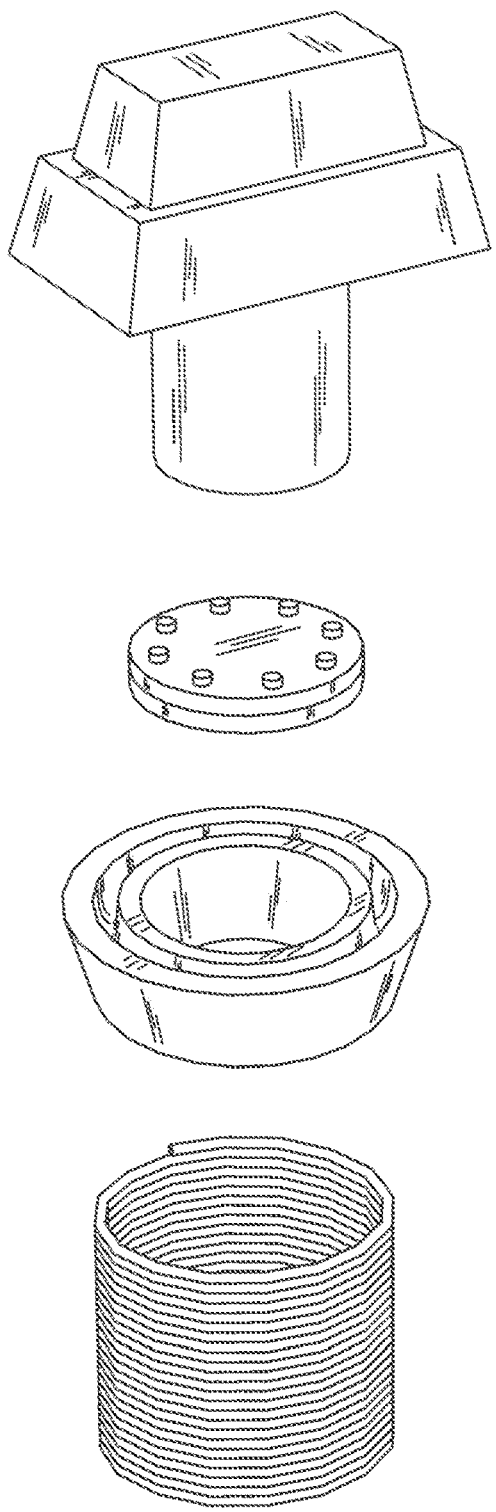
FIG. 4 is a simplified exploded view of the induction button.

With continued reference to FIGS. 4 and 5A, the coils 146 include a plurality of electrically conductive wires or other conductor arranged in a coil. For example, the coils 146 may be formed of copper, silver, electrical conductive polymers, or other conductive materials. The coils 146 may include a plurality of wires that are arranged together to form a the coil 146. The coil 146 may be connected to sidewalls 176 of the enclosure 114 surrounding the button aperture 162. In this manner, the coil 146 may surround at least a portion of the magnetic element 170 when the button cap 140 moves vertically relative to the enclosure 114. In other words, the coil 146 may be connected to the enclosure 114 or other portion of the electronic device 100 to allow magnetic communication between the magnetic element 170 and the coil 146. The coil 146 is in communication with the processing element 124 and signals created by the coil 146 may be provided to the processing element 124 and the processing element 124 may control the level of current provided to the coil 146 from the power source 122 or otherwise.

The induction button 106 may further include a seal 152 connected to the button cap 140 and the enclosure 114. The seal 152 is configured to substantially prevent fluids, such as water, and debris from entering into the cavity 164 through the button aperture 162, while still allowing the button cap 140 to move within the button aperture 162. For example, the seal 152 may be a gasket formed of a flexible material, such as rubber or silicone, or the seal 152 may be an O-ring received around the button cap 140 or another sealing element.

In some embodiments, the coil elements may be formed within the seal 152. For example, the material forming the seal may be deposited around the coil, which embeds the coil within the seal.

With reference to FIGS. 4 and 5A, in embodiments where the seal 152 is a gasket, the seal 152 may include a tab 154 and a sealing body 156 that extends from the tab 154. The tab 154 may be received in an annular groove 158 defined in the enclosure 114 and may be secured to an interior surface 166 of the enclosure 114 by an adhesive or other securing component. The sealing body 156 expends from the tab 154 downward and then loops back on itself to connect to a sidewall 160 of the button cap 140. Additionally, the sealing body 156 may also be connected to the sidewalls of the magnetic element 170, e.g., via adhesive or other securing element. The seal 152 may flex as the button cap 140 is moved, maintaining the connections to the enclosure 114 and the button cap 140, substantially preventing fluids and/or debris from entering in the cavity 164.

In some embodiments, the seal 152 may be positioned, at least in part, between the magnetic element 170 and the coil 146. However, the magnetic element 170 and the coil 146 may be sufficiently close together that the two elements may be in magnetic communication therethrough.

Figure 5B:
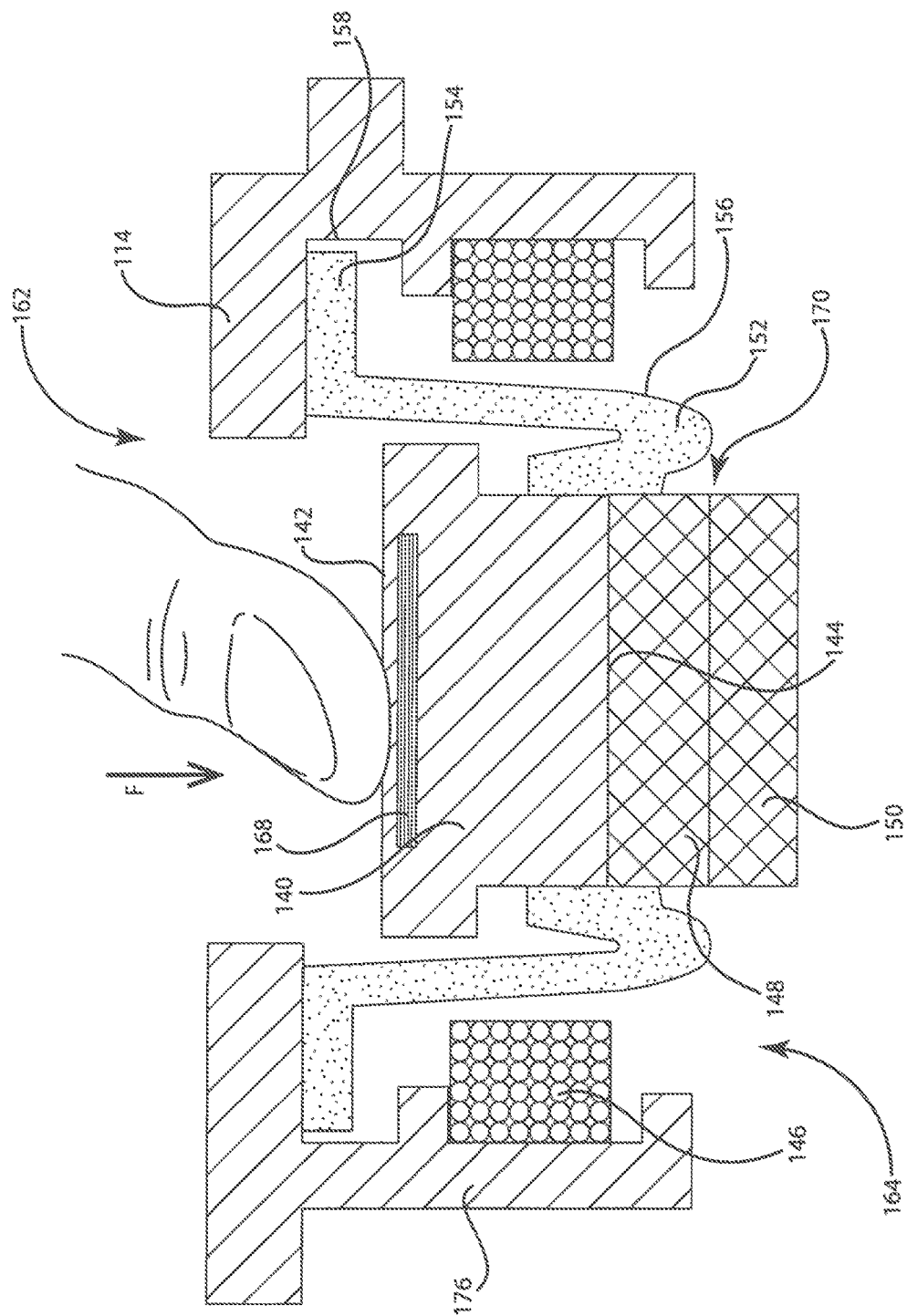
FIG. 5B is a cross-section view of the electronic device illustrating a force applied to the induction button.

Operation of the induction button 106 will now be discussed in more detail. FIG. 5B is a cross-section view of the induction button 106 as an input force is applied to the button cap. With reference to FIG. 5B, the user may apply a force F to the top surface 142 of the button cap 140. The force F causes the button cap 140 to travel vertically relative to the enclosure 114 and travel towards the internal cavity 164. As the button cap 140 travels downward, the seal 152, in particular, the sealing body 156 stretches to accommodate the travel, while still remaining anchored to the enclosure 114 and the button cap 140.

With continued reference to FIG. 5B, as the button cap 140 travels into the cavity 164, the magnetic element 170 changes position relative to the coil 146. In particular, the magnetic poles 148, 150 are moved vertically within the space defined by the coil 146. As the magnetic element 170 moves relative to the coil 146, a current is produced in the coil 146 through electromagnetic induction, the current or a signal corresponding to the current may then be provided to the processing element 124. The signal may be correlated by the processing element 124 to a user input, which may be used to adjust, modify, activate, deactivate, or the like, one or more parameters for the electronic device 100. For example, the button 106 may be activated by the user to indicate the user's desire to select a particular icon presented on the display 102. As another example, the induction button 106 may be selected by a user to turn the electronic device 100 into an active state, an idle state, or to turn the electronic device 100 off. The induction button 106 may be used to provide input that may be used by the electronic device 100 in a number of manners and the above examples are meant as illustrative only.

The induction button 106 may produce an input signal corresponding to the user force F and provide that signal to the processing element 124, but may not draw power from the power source 122 in order to do so. In particular, while the button 106 is idle or otherwise not selected, the input button 106 may not draw any power. In fact, the input button 106 generates current which is used to indicate the user input to the button 106. In this manner, the button 106 may not reduce the stored energy for the electronic device 100, which may allow the power source 122 to last longer between being recharged.

In some embodiments, the input button may be configured to detect vary speeds at which the button cap is pressed by a user. As one example, the speed at which the button cap is compressed may vary the input signal provided by the input button to the processing element 124. In particular, the faster that the button cap is compressed the faster that the magnetic elements may move past the coil, which in turn may induce a reduced current level as compared to slower speeds.

With reference again to FIGS. 4 and 5A, in some embodiments, the induction button 106 may further include a sensing element 168. The sensing element 168 may be connected to the button cap 140 and/or portions of the enclosure 114. The sensing element 168 may be configured to detect a user input, such as, but not limited to, a capacitive sensor (sensing grid), a resistive sensor, an accelerometer, a gyroscope, or the like. In these embodiments, the sensing element 168 may be in a sleep or off mode while the electronic device 100 is in a first state, such as a sleep or idle state. In this state, the sensing element 168 may not draw any power or may draw limited power from the power source 122. However, with the reduced power, the sensing element 168 may be limited in detecting a user force. In these embodiments, the signal produced by the coil 146 when the user compresses the button cap 140, may be used to activate the sensing element 168. In other words, once the coil 146 detects movement of the button cap 140 and magnetic element 170, the processing element 124 may wake the sensing element 168 and provide the sensing element 168 with full power. Once the sensing element 168 is active, the sensing element 168 may be used to detect another type of characteristic of the user input. For example, the sensing element 168 may be used to detect the location of the user input to the button cap 140, a rotational aspect of the user input, a degree of force of the user input, or the like. The type of parameters sensed by the sensing element 168 may be varied and the above examples are meant as illustrative only.

In embodiments where the induction button 106 may include a sensing element 168, the induction components of the induction button 106 may be used to save or reduce power consumption for the electronic device j100. For example, if the sensing element 168 were used on its own to detect user input, the sensing element 168 may have to remain in an active state, drawing power, even if the electronic device 100 was ide. However, because the coil 146 and magnetic element 170 may not require power and can be used to detect a user input, the sensing element 168 may be provided with power only when a user input is being applied, reducing power. The sensing element 168 may allow the device 100 to detect more characteristics of the user input and/or capture more intricate measurements of the user input or other user parameters.

Figure 6:
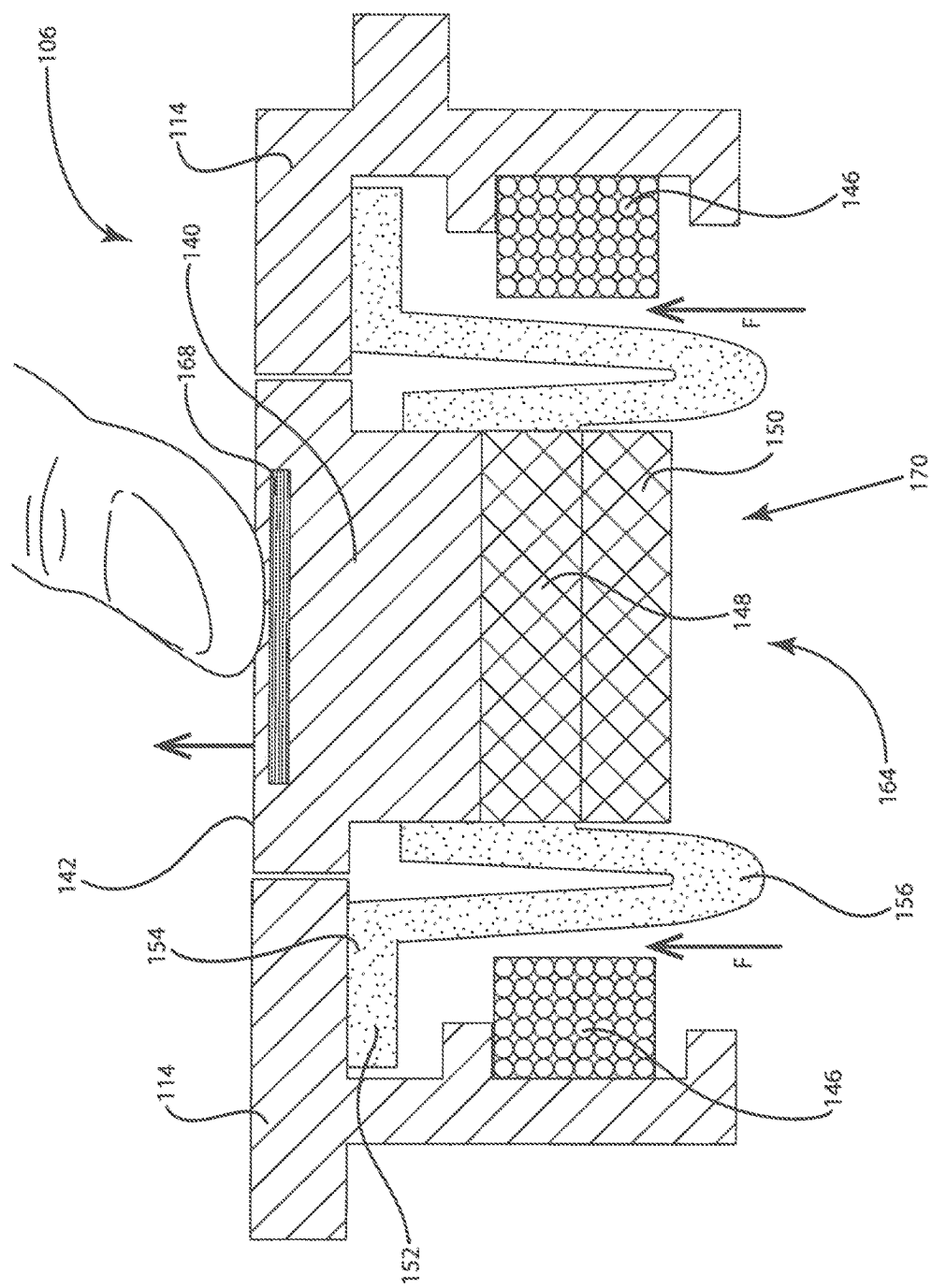
FIG. 6 is a cross-section view of the electronic device illustrating a second example of the induction button.

In some embodiments, the induction button 106 may also be used to provide feedback to a user. FIG. 6 is a cross-section view of the input button as a feedback force is provided to the user. With reference to FIG. 6, in instances where feedback, such as haptic or tactile feedback, may be desired, the processing element 124 may provide current to the coil 146 . As the current travels through the coil 146, a magnetic field is created that may be used to selectively repel or attract the magnetic element 170. In one example, as shown in FIG. 6, the coil 146 may be configured to repel the magnetic element 170, exerting a feedback force F upwards towards the top surface of the enclosure 114, e.g., away from the cavity 164. The user's finger, which may be positioned on the top surface 142 of the button cap 140 experiences the feedback force, which may be correlated to the user's input indicating to the user that the button 106 was selected. It should be noted that although the feedback force F is shown in the vertical direction opposite direction of the use's input force, in some embodiments the feedback force F may be in the same direction as the user's force, or may be at an angle relative to the user's input force. In these embodiments, the induction button 106 may function as an electric motor and move the button against the user's finger.

In embodiments where the input button is used to provide feedback to a user, the thickness or z-height of the input button may not be substantially affected by the feedback mechanism. In buttons including tactile feedback components, such as collapsible domes or tactile switches, the feedback component (tactical switch or dome) is typically positioned in series with the direction of travel of the button. In other words, the feedback component is aligned so as to be compressed when the button is compressed, which often requires an increase in thickness to accommodate the travel of the button and the compression of the feedback component. On the contrary, the induction button 106 may provide feedback to the user, but does not require an increase in the thickness. This is because the coil 146 is adjacent to or parallel to the direction of motion and thus does not increase the thickness of the input button. Additionally, in some embodiments the button cap 140 may be formed of a magnetic material and the magnetic element 170 may be omitted. In these embodiments, the height of the input button may not be substantially impacted by the feedback component, e.g., the coil in this example.

With continued reference to FIG. 6, in instances where the induction button 106 provides feedback to a user, the feedback may not be substantially effected by the seal 152. In some waterproof button designs that include user feedback, such as those that use an elastomeric seal between the button and a tactile switch, the elastomeric seal may be compressed between the tactile switch and the button cap. These designs may reduce the tactile feedback or click feel to a user. For example, the elastomeric seal positioned between the tactile switch and the button may have a dampened or "squishy" feel. On the contrary, the induction button 106 may provide a feedback force through magnetic interaction between the coil 146 and the magnetic element 170 and so the seal 152 may not substantially dampen or affect the feedback feel of the input button.

Figure 7:
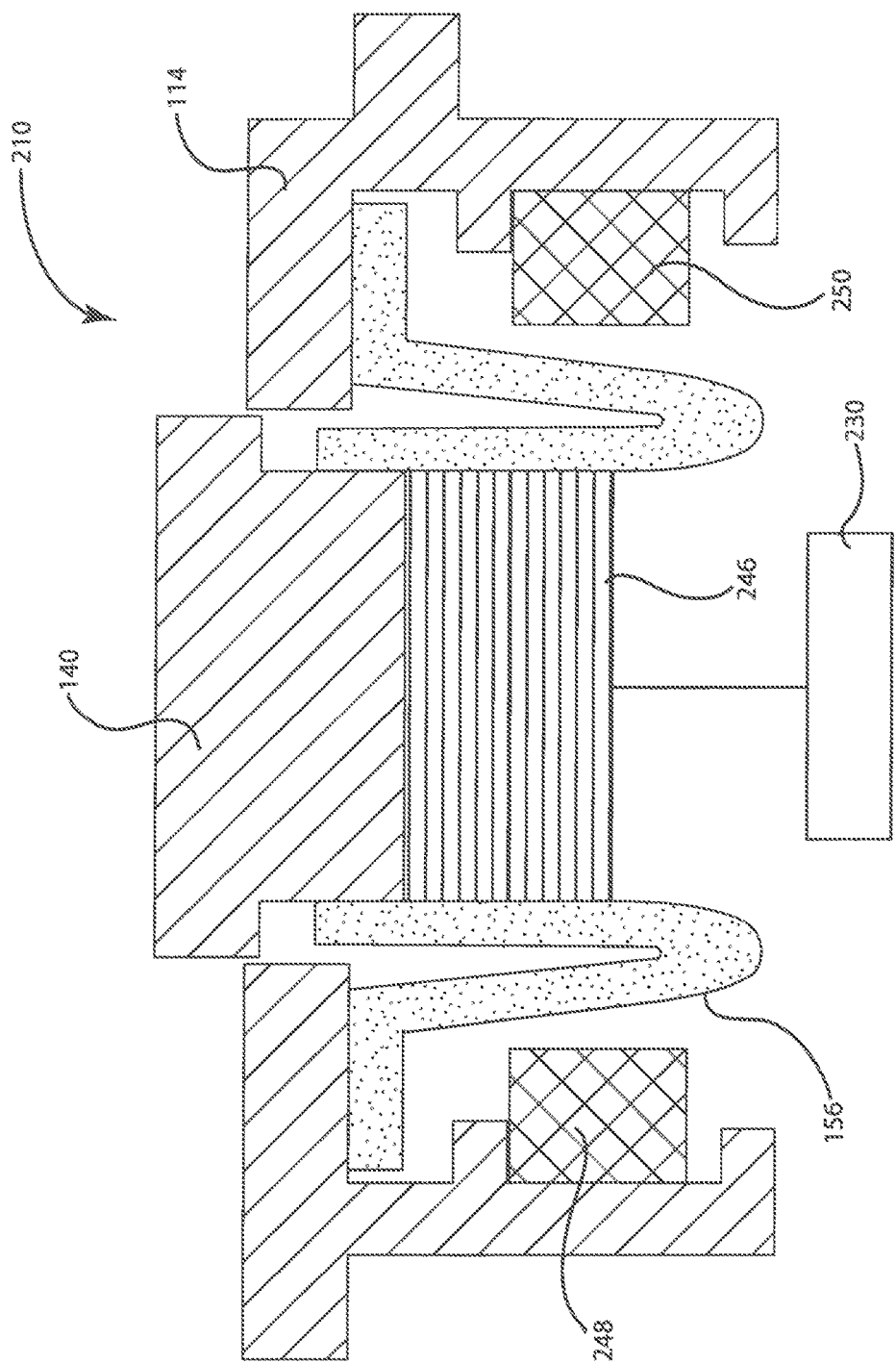
FIG. 7 is a cross-section view of the electronic device illustrating a third example of the induction button.

In some embodiments, the magnetic element may be positioned on the enclosure. FIG. 7 is a cross-section view of another example of the input button. With reference to FIG. 7, the input button 210 may be substantially similar to the induction button 106, but the coil 246 may be operably connected to the button cap 140 and the magnetic elements 248, 250 may be operably connected to the enclosure or otherwise surround the button cap 140. In this example, the first magnetic element 248 may be positioned on a first side of the button cap and the second magnetic element 250 may be positioned on a second side of the button cap. Alternatively, both magnetic elements may surround the button cap 140 and may be stacked on top of one another. In yet other embodiments, the button 210 may include a single magnetic element that may be connected to the enclosure and may at least partially surround the base of the button cap 140.

With continued reference to FIG. 7, the coil 246 may be wrapped around a portion of the button cap 140, such as a shaft of the button cap 140. The coil 246 may include a plurality of wires that extend around the exterior surface of the button cap. In some embodiments, the shaft of the button cap may include a recessed annular groove in which the coil 246 may be received. Additionally, the coil 246 may be in communication with an electrical contact 230, that may provide a signal to the processing element 124. The electrical contact 230 may be a brush contact or a cycling mechanical contact that does not restrict motion of the coil 246 or button cap 140, but is able to communicate with the coil 246 when a current is activated in the coil 2246. As one example, the electrical contact 230 may be in communication with the coil 246 only when the button cap 140 is compressed. In one implementation, the electrical contact 230 may be positioned at a distance below the button cap 140 where the electrical contact 230 may only contact the coil when the button cap is depressed. As another example, the electrical contact 230 may be in contact with the coil 246 in a number of different positions of the button cap 140. In this example, the electrical contact may be better able to provide current to the coil in instances where feedback is desired and may detect user inputs that may not fully compress the button cap 140.

In operation, a user may compress the button cap 140, which may cause the button cap 140 and the coils 246 which are connected thereto to move laterally relative to the enclosure 114 and magnetic elements 248, 250. As the coil 246 moves past the magnetic elements 248, 250 a current may be included in the coil 246. As the current is induced, the current is transmitted to the electrical contact 230 via a connection between the contact 230 and the coil 246. The electrical contact 230 may then provide the signal to the processing element 124 that registers the user input. Additionally, in instances where feedback may be desired, the processing element may provide a signal to the electrical contact 230 that may provide current o the coil 246. The characteristics of the signal provided to the coil 246 may be selected such that the magnetic force created by the current flowing through the coil 246 may repel the magnetic element 248, 250 causing the button cap 140 to move away from the magnetic elements forcing the button cap 140 against a user's finger.

CONCLUSION

The foregoing description has broad application. For example, while examples disclosed herein may focus on a wearable electronic device, it should be appreciated that the concepts disclosed herein may equally apply to substantially any other type of electronic device. Similarly, although the input button may be discussed with response to a compressible button, the devices and techniques disclosed herein are equally applicable to other types of input structures. Accordingly, the discussion of any embodiment is meant only to be exemplary and is not intended to suggest that the scope of the disclosure, including the claims, is limited to these examples.

What is claimed is:

1. An electronic device comprising:
   an enclosure;
   a button connected to the enclosure and movable relative thereto, the button comprising:
      a button cap defining a user input surface;
      a first magnetic element operably associated with the button cap; and
      a coil operably associated with the enclosure; and
   a seal surrounding the button cap and positioned between the first magnetic element and the coil;
      wherein movement of the button cap in a first direction relative to the enclosure causes the first magnetic element to induce a current in the coil; and the induced current is correlated to a user input to the button cap.

2. The electronic device of claim 1, wherein the first magnetic element is connected to a bottom end of the button cap and the coil is connected to the enclosure.

3. The electronic device of claim 1, wherein the first magnetic element is connected to the enclosure and the coil is connected to a portion of the button cap.

4. The electronic device of claim 1, wherein the button does not require power.

5. The electronic device of claim 1, further comprising a second magnetic element connected to the first magnetic element, wherein the first magnetic element has a first polarization and the second magnetic element has a second polarization.

6. The electronic device of claim 1, further comprising:
   a power source; and
   a processing element in communication with the power source and the coil; wherein the processing element selectively provides a signal to the coil to move the button cap in a second direction relative to the enclosure.

7. The electronic device of claim 1, further comprising:
   a processing element; and
   a sensor operably connected to the button cap and in communication with the processing element, wherein the induced current in the coil is provided to the processing element; and after the current has been induced in the coil, the processing element activates the sensor.

8. The electronic device of claim 7, wherein the sensor is configured to detect a location of the user input to the button cap.

9. The electronic device of claim 7, wherein the sensor is configured to detect a rotational aspect of the user input to the button cap.

10. The electronic device of claim 1, wherein the electronic device is a watch.

11. An input assembly for a computing device comprising:
    a housing;
    a user input surface operably connected to the housing and movable relative thereto;
    a magnetic element connected to the user input surface;
    an induction component operably connected to the housing and in communication with the magnetic element; and
    a gasket connected to the housing and the user input surface and positioned between the induction component and the magnetic element;
    wherein in a first mode, when a user force is applied to the user input surface, the user input surface moves in a first direction causing the magnetic element to move relative to the induction component, inducing a first signal in the induction component.

12. The input assembly of claim 11, wherein in a second mode, a second signal is applied to the induction component, which interacts with the magnetic element to cause the magnetic element and user input surface to move in a second direction.

13. The input assembly of claim 12, further comprising a power source, wherein in the first mode the induction component is not in communication with the power source and in the second mode the induction component is in communication with the power source.

14. The input assembly of claim 12, wherein the first signal is a reverse of the second signal.

15. The input assembly of claim 11, wherein the induction component comprises one or more conductive wires arranged in a coil.

16. The input assembly of claim 11, further comprising a sensing element operably connected to the user input surface, wherein when the first signal is induced in the induction component, the sensing element is activated and configured to detect a user input to the user input surface.

17. The electronic device of claim 16, wherein the sensing element is configured to detect a location of the user input to the user input surface.

18. The electronic device of claim 16, wherein the sensing element is configured to detect a rotational aspect of the user input to the user input surface.

19. The input assembly of claim 11, wherein in an idle mode, the induction component does not receive power from a power source.

20. The input assembly of claim 11, wherein the housing is a housing for a watch.

* * * * *